(12) United States Patent
Janzen

(10) Patent No.: US 8,723,134 B2
(45) Date of Patent: May 13, 2014

(54) ELECTROSTATIC CORRECTOR

(75) Inventor: Roland Janzen, Zwingenberg (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 725 days.

(21) Appl. No.: 12/914,252

(22) Filed: Oct. 28, 2010

(65) Prior Publication Data

US 2011/0147605 A1    Jun. 23, 2011

(30) Foreign Application Priority Data

Dec. 22, 2009    (EP) ..................................... 09180489

(51) Int. Cl.
*H01J 37/153*    (2006.01)
(52) U.S. Cl.
USPC ..................................................... 250/396 R
(58) Field of Classification Search
CPC ..................................................... H01J 37/153
See application file for complete search history.

(56) References Cited

U.S. PATENT DOCUMENTS

| | | | |
|---|---|---|---|
| 6,037,601 A | 3/2000 | Okunuki | |
| 6,670,625 B1 * | 12/2003 | Rand et al. | 250/492.3 |
| 6,861,651 B2 * | 3/2005 | Rose | 250/396 R |
| 7,763,866 B2 * | 7/2010 | Frosien et al. | 250/492.23 |
| 2002/0000766 A1 | 1/2002 | Ono et al. | |
| 2011/0079731 A1 | 4/2011 | Kim | |

FOREIGN PATENT DOCUMENTS

| | | |
|---|---|---|
| DE | 198 02 409 A1 | 7/1999 |
| DE | 100 01 277 A1 | 7/2001 |
| DE | 10 2006 017 686 A1 | 10/2007 |
| EP | 0 451 370 A1 | 10/1991 |
| WO | WO2009-145556 A2 | 12/2009 |

OTHER PUBLICATIONS

Extended European Search Report dated Apr. 13, 2010 for application EP 09 180 489.8, filed Dec. 22, 2009.
Office Action dated Mar. 5, 2012 for European Patent Application No. 09180489.8.

* cited by examiner

*Primary Examiner* — Jack Berman
(74) *Attorney, Agent, or Firm* — Patterson & Sheridan, LLP

(57) ABSTRACT

A correction device for a charged particle beam device for decreasing, correcting or inverting (that is adjusting) the spherical aberration of a charged particle beam is described. The correction principle is similar to that of common multipole-Correctors. But unlike common devices of that kind this new correction device gets along entirely with plane apertures having specially shaped holes in order to supply the multipoles required for correction and is therefore predestined for miniaturization and the use in multi column devices.

24 Claims, 9 Drawing Sheets

ELECTROSTATIC CORRECTOR

FIELD OF THE INVENTION

Embodiments of the present invention relate to a charged particle beam device, particularly to a charged particle beam device having an electrostatic correction device for allowing correcting aberrations. Further, they relate to a method of correcting aberrations in a charged particle beam device. Specifically, they relate to a correction device for a charged particle beam device for correcting aberrations of a charged particle beam.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimen within the micrometer and nanometer scale.

Charged particle beam devices such as ion beam devices, electron beam devices and the like, have experienced an increasing demand throughout the recent years. Due to their application for inspection services, the requirements for the charged particle beam devices have also increased with regard to their construction and performance, e.g. for use in production lines.

Modern charged particle beam devices, particularly those for inspection applications, testing applications, lithography applications and the like, but also those for analyzing applications, are therefore often miniaturized, using inter alia mini-lenses to decrease the device size. Further, there is a desire to reduce the optical path of a charged particle beam device for devices which would not be considered as being miniaturized per se.

In order to improve the function of a miniaturized lens in a charged particle beam device, a tool is provided that utilizes a miniaturized construction and allows the correction of the spherical aberrations within a charged particle beam device.

SUMMARY

In light of the above, a correction device according to independent claim 1, a charged particle beam device according to claim 10 and a method of correcting an aberration according to independent claim 13 are provided.

According to one embodiment, a correction device for a charged particle beam device is provided for correcting aberrations of a charged particle beam. The correction device includes a stack of plates arranged along an optical axis of the charged particle beam device. The stack of plates includes at least a first and a second multipole plate assembly, wherein the first and the second multipole plate assembly each includes at least a first multipole plate with an n-fold symmetry aperture arrangement, wherein the number of poles of the multipole of the multipole plate is 2n and the multipole plates are adapted to be biased to one potential respectively.

According to a further embodiment, a method of correcting an aberration of a charged particle beam in a charged particle beam device is provided. The charged particle beam device has an optical axis and stack of plates, with an electrostatic multipole corrector. The method includes providing at least a first and a second multipole plate assembly, which includes each at least one multipole plate arranged along the optical axis and thereby, forming the stack of plates; generating a multipole by the multipole plate of the first multipole plate assembly and generating a multipole by the multipole plate of the second multipole plate assembly, wherein the multipoles are generated by biasing the multipole plates to a single potential respectively.

Further advantages, features, aspects and details, which can be combined with embodiments described herein, are evident from the dependent claims, the description and the drawings.

Embodiments are also directed to apparatuses for carrying out the disclosed methods and including apparatus parts for performing each described method step. These method steps may be performed by way of hardware components, a computer programmed by appropriate software, by any combination of the two or in any other manner. Furthermore, embodiments according to the invention are also directed to methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF THE INVENTION

Figure 1:
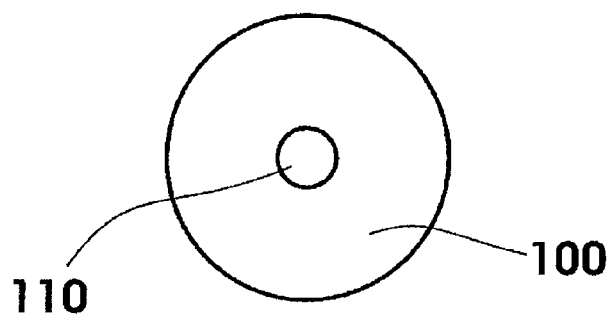
FIG. 1 shows a schematic view of an aperture plate according to embodiments described herein.

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

The performance of any optical system deviates from its predicted, theoretical behavior. This is due to aberrations, which appear in optical elements such as lenses or the like. In order to correct these aberrations, e.g. spherical and chromatic aberrations, it is known to use magnetic and/or electrostatic multipoles.

The spherical aberration is e.g. a consequence of the refraction power of rotationally symmetric lens fields increasing with axial distance. For years, the correction of the spherical aberration is an object of charged-particle optics. The use of two magnetic hexapoles arranged in a manner that the non-circular effects of both compensate, is a proved principle. The remaining effect of the combination of the hexapoles is approximately rotationally symmetric and increases towards the outside in a cubic manner.

Over the course of miniaturizing charged particle beam devices, and/or reducing path lengths of the charged particle beam devices, the lenses are decreased in size but still provide the above mentioned aberrations, thereby limiting the performance and the accuracy of the device. The magnetic or electrostatic multipoles for correcting aberrations are only reducible in size to a certain degree. Consequently, it has not been possible to effectively correct the aberrations in a short or miniaturized charged particle beam device. The embodiments of the invention described herein however present concepts of a multipole corrector for the spherical aberration that may be easily miniaturized.

Further, a reduced complexity, e.g. a reduced complexity of control signals for the corrector, can result in an improved possibility to form an array of correctors. Thus, a reduced complexity of the corrector and/or the ability to miniaturize the corrector can be beneficial for multi-beam applications, in which a plurality of charged particle beams is used.

The idea of the embodiments described herein is the principle of generating electrostatic multipoles by using stacks of apertures on different potentials with aperture holes having non rotationally symmetric shapes. The detailed description is based upon an application of this principle realizing a hexapole corrector for the spherical aberration. This is due to the fact that the theoretical proof of concept was done by a computer simulation of this first application. This does not mean that the scope of protection is restricted to hexapole correctors. This principle will work for quadrupole-octupole-correctors or other multipole correctors as well.

For these purposes, embodiments described herein provide a correction device, which can be used for correcting the spherical aberration by providing a consecutive stack of electrostatic elements, such as aperture plates and multipole plates, for instance hexapole plates. The corrector is able to replace magnetic and/or electrostatic elements, which provide more than one potential in the plane in which they are arranged. This plane is to be understood to be substantially orthogonal to the optical axis. Therefore, for conventional multipole correctors, different magnetic and/or electric potentials are provided by magnetic and/or electrostatic elements in one plane orthogonal to the optical axis and arranged in a certain position along the optical axis. If for example such common correction devices would be provided in the form of an electrostatic corrector, more than one potential would be provided in a plane essentially perpendicular to the optical axis.

Generally, when referring to a "stack of plates", it is to be understood as a predetermined plurality of plates, having a certain distance along the optical axis between them, which can be varied from plate to plate.

Further, the term "multipole plate" should be understood as a plate, which is able to generate a multipole field. The multipole plate may be arranged within a plate assembly including a plurality of aperture and multipole plates.

Typically, with embodiments described herein, the stack of plates replaces the magnetic or electrostatic multipoles, which require at least two electrical or magnetic potentials in one plane. With the present embodiments, the miniaturization of the charged particle beam device, in which the corrector is used, becomes easier.

According to embodiments described herein, a multipole plate, partitioning two spaces with different electrical field strength, can generate an overlap of the field of an electrostatic round lens and an electrostatic multipole. By arranging a plurality of aperture plates and multipole plates in a certain manner, an electrostatic multipole corrector can be constructed, which has the same effect as a conventional multipole corrector and which can be used in miniaturized charged particle beam devices in order to correct aberrations.

Within the following description of the drawings, the same reference numbers refer to the same components. Generally, only the differences with respect to the individual embodiments are described.

FIG. 1 shows an example of a single aperture plate as used in embodiments described herein. The aperture plate 100 includes a plate with an aperture hole 110 in it. The outer shape of the plate 100 is of no interest and can be chosen arbitrarily, though shown round in the figure, which can be approximately circular. The aperture plate 100 allows for trespassing of a particle beam substantially along an optical axis of a charged particle beam device.

Figure 2A:
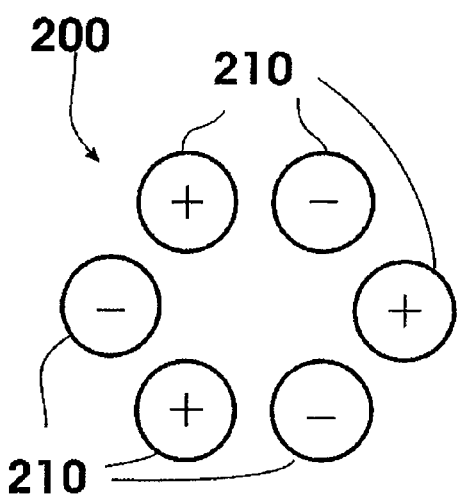
FIG. 2a shows a schematic view of a multipole known in the art.

In FIG. 2a, a common hexapole 200 is shown. Generally, a multipole includes a plurality of electrostatic elements, which are on different or periodically different potentials in order to generate a multipole field, and/or magnetic elements, which are provided with different or periodically different currents in order to generate a multipole field. In the example of FIG. 2a, a hexapole 200 is shown including six magnetic and/or electrostatic elements 210. Each of the elements or each group of elements can be controlled individually.

Figure 2B:
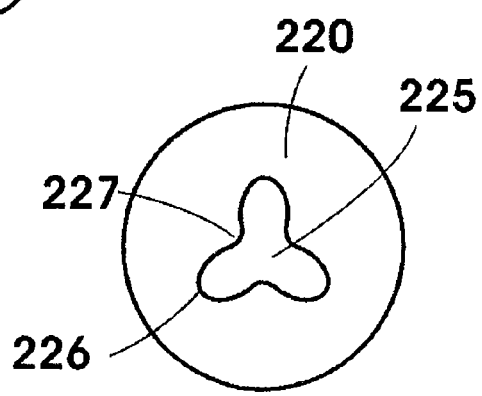
FIG. 2b shows a schematic view of a multipole plate according to embodiments described herein.
Figure 2C:
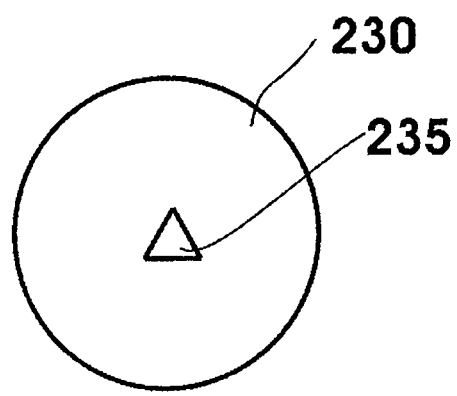
FIG. 2c shows a schematic view of another multipole plate according to embodiments described herein.
Figure 2D:
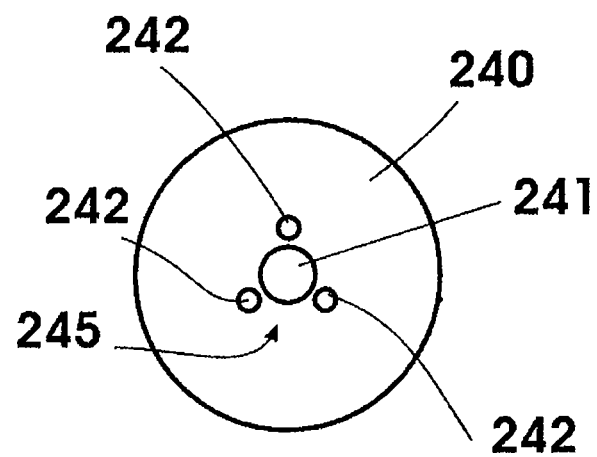
FIG. 2d shows a schematic view of yet another multipole plate according to embodiments described herein.

According to different embodiments, which can be combined with other embodiments described herein, a multipole plate includes a plate with arbitrary outer shape and an inner shape which has an n-fold symmetry, wherein 2n is the number of poles in the multipole. For instance, a hexapole can be generated by a 3-fold symmetry, which can be provided by a triangular shape of the aperture hole, as shown in FIGS. 2b and 2c, additional supporting openings disposed around a round hole, e.g., additional openings around a hole in the center, as shown in FIG. 2d or other 3-fold symmetry aperture arrangements. Such hexapole plates create electrostatic hexapoles by adding a 3-fold distribution of the flux of the electric field through the opening(s).

FIGS. 2b and 2c show schematic views of a hexapole plate as examples for the more general multipole plates according to embodiments described herein.

FIG. 2b shows exemplarily a hexapole plate according to embodiments described herein. The plane hexapole plate 220 may have an aperture 225, which also has a 3-fold symmetry shape. The outer shape of the aperture 225 of FIG. 2b provides three wave crests 226 and three wave troughs 227. In other words, the outer shape of the aperture 225 resembles three connected cloverleaves. Typically, an aperture is to be understood as a hole in a plate, through which a charged particle beam can pass.

In FIG. 2c, another hexapole plate 230, according to further embodiments described herein, is shown. The aperture 235 has a triangular shape. In this embodiment the triangle is an equilateral triangle. Generally, the aperture in the hexapole plate can have any shape, which has a 3-fold symmetry.

FIG. 2d shows another embodiment of the hexapole plate 240. The geometry of the aperture 245 consists of a round hole 241 and three small holes 242 being arranged circumferentially around the first hole 241. The small holes 242 may also have a round shape. Thereby, for example, the centers of the small holes 242 compose an equilateral triangle. The surrounding holes may have the same diameter or even larger diameters than the central one (which is passed by the beam). For instance, in multi column arrays having a correction device according to embodiments described herein, beamlets pass through multi-hole apertures. In this case, the hexapoles might be produced in an arrangement of the holes through which the beamlets of the multi-column arrangement pass that means the multiple columns of the beamlets. Further details of the multi-column arrangement are explained below.

According to further embodiments, the outer shape of the aperture plates and the hexapole plates shown in FIGS. 2b to 2d may vary in a certain range. The shown embodiments have a circular shape, but may also have any other shape.

According to some embodiments described herein, the apertures of the aperture plates (as shown in FIG. 2a) as well as the aperture of the hexapole plates (as shown in FIGS. 2b to 2d) have a fixed size. The fixed size cannot be varied for one plate, although different plates may have different aperture sizes.

According to some embodiments, the thickness of the aperture and the hexapole plates is typically between 50 μm and 150 μm, more typically between 80 μm and 120 μm, and even more typically between 90 μm and 110 μm. Thus, the thickness can be, for example, 80 μm, 100 μm or 120 μm. According to some embodiments, which can be combined with any of the other embodiments described herein, the diameter of the aperture may be between 10 μm and 100 μm, more typically between 20 μm and 80 μm, and even more typically between 30 μm and 70 μm. The aperture of the aperture plate may have a diameter of 20 μm, 50 μm, or 70 μm.

Figure 3:
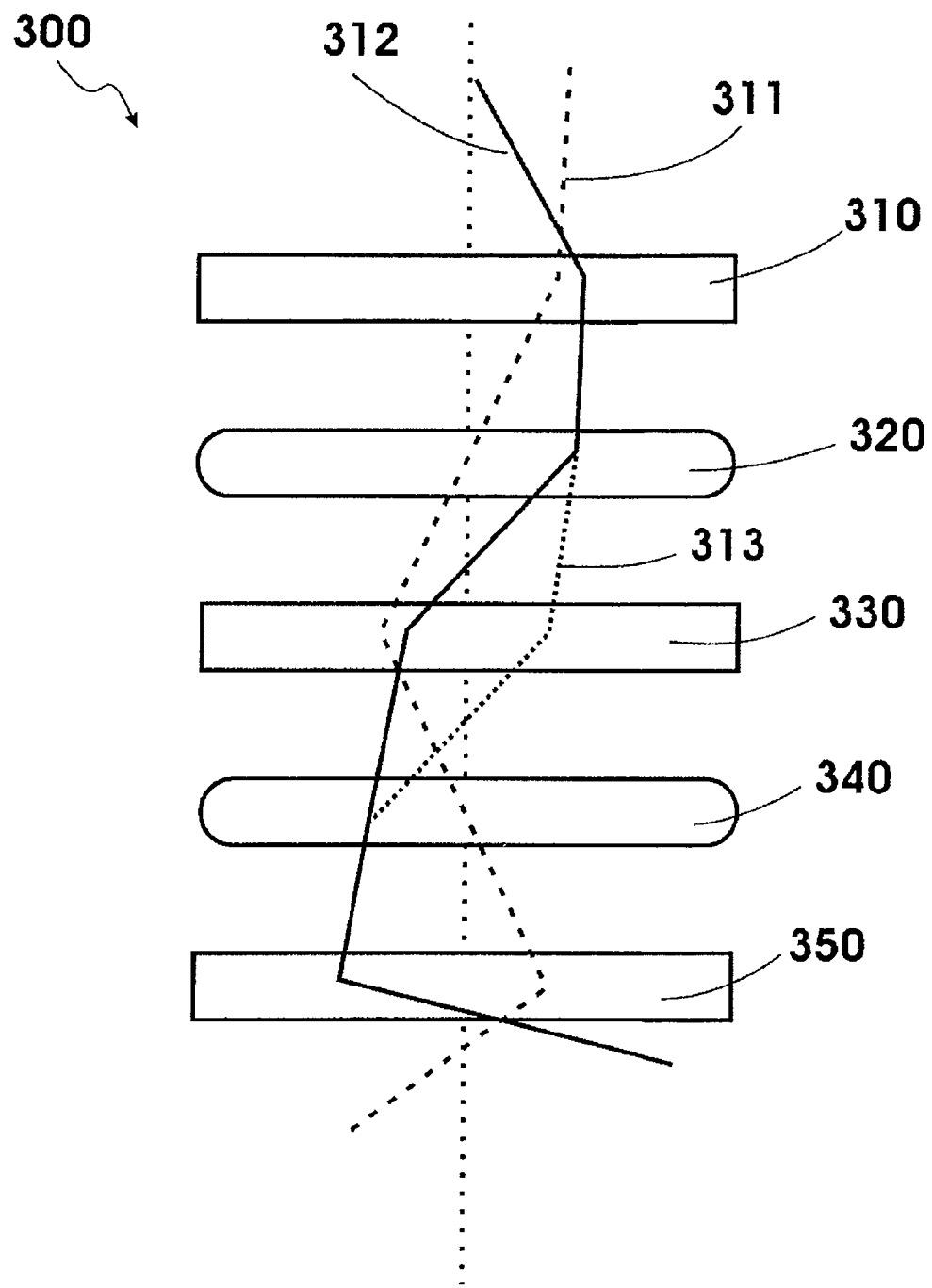
FIG. 3 shows a schematic view of a stack of plate assemblies according to embodiments described herein.

A stack of the above described plates according to embodiments described herein is shown in FIG. 3. The stack of plates 300 includes a first aperture plate assembly 310, a first hexapole plate assembly 320, a second aperture plate assembly 330, a second hexapole plate assembly 340, and a third aperture plate assembly 350. Further, beam paths 311, 312, and 313 are shown in FIG. 3.

The hexapole plate assemblies are included in a correction device as described herein. According to yet further embodiments, which an be combined with other embodiments described herein, more generally, a first and second multipole plate assembly can be used for other order corrections. Thus, in the following passages reference is made to a multipole plate assembly, even though the examples shown in the respective drawings might be provided for hexapole correction.

Beam path 311 is a path of an off-axial ray, which is also denoted as γ-ray, which has a zero in the multipole plate assemblies and therefore is rotationally symmetric. Ray 312 originates from the object, e.g., the center of the object, the source or an intermediate image and is referred to as the α1-ray. Beam path 313 is denoted by α2-ray. As can be seen from the comparison of beam path 312 and beam path 313, the α-ray does not have a rotational symmetry, at least not between the multipole plate assemblies 320 and 340. This asymmetry constitutes a 3-fold astigmatism, which is introduced by the first multipole plate assembly 320 and which is compensated by the second multipole plate assembly 340.

Astigmatism occurs, when rays that propagate in two perpendicular planes have different foci. Therefore, when for instance an image of a cross is formed by a system with astigmatism, the vertical and horizontal lines will be in sharp focus at two different distances. The 3-fold astigmatism is a special case of the astigmatism and appears for objects, which are away from the optical axis.

Figure 4A:
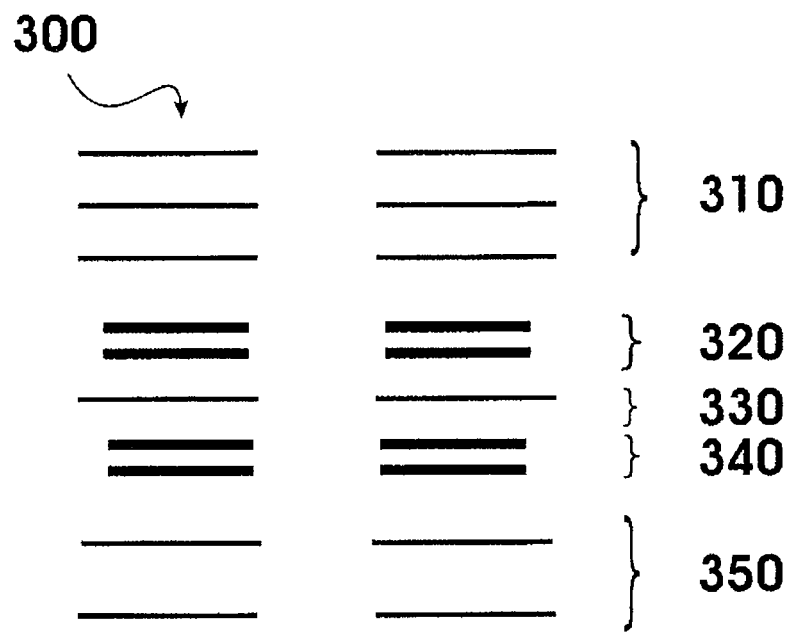
FIG. 4a shows a schematic, more detailed view of the plate assemblies according to embodiments described herein.

An example of the configuration of the plate assemblies is given in FIG. 4a. In this embodiment, the first aperture plate assembly 310 includes three aperture plates, the first multipole plate assembly 320 includes a duplet of multipole plates, the second aperture plate assembly 330 includes one aperture plate, the second multipole plate assembly 340 includes a duplet of multipole plates, and the third aperture plate assembly 350 includes two aperture plates.

Figure 4B:
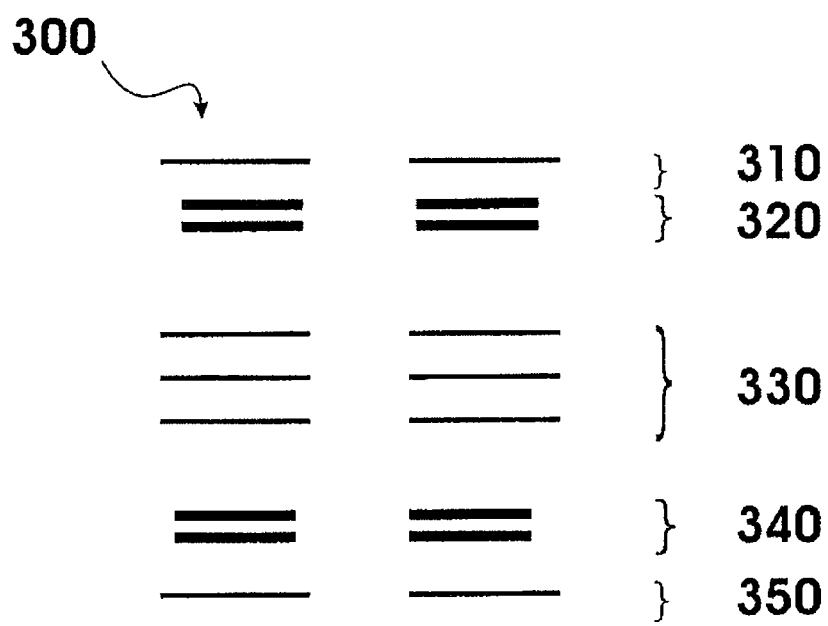
FIG. 4b shows another schematic, more detailed view of the plate assemblies according to embodiments described herein.

According to even further embodiments, which can be combined with other embodiments described herein, the number of apertures and multipole plates can vary in the different assemblies, as shown in FIG. 4b for instance. In FIG. 4b, the stack 300 also includes a first aperture plate assembly 310 having a single aperture plate, a first multipole plate assembly 320 having a duplet of multipole plates, a second aperture plate assembly 330 having a triplet of aperture plates, a second multipole plate assembly 340 having a duplet of multipole plates and a third aperture plate assembly 350 having a single aperture plate.

According to some embodiments, the plates are arranged in different planes, which are substantially perpendicular to the optical axis. Each plate is therefore arranged in a respective plane, which has a certain distance to the adjacent plate in the respective plane.

Typically, the first aperture plate assembly 310 and the third aperture plate assembly 330 adjust the zeros of the fundamental (Gaussian) rays. According to typical embodiments, the third aperture plate 330 might be in the middle, e.g., a symmetric position with respect to the adjacent apertures.

According to some embodiments, depending on the degree of miniaturization of the column, the column potential and the maximum allowed field strengths, the longitudinal size of the corrector device 300 may be typically less than 0.05 m, more typically less than 0.035 m and even more typically less than 0.025 m.

According to another embodiment, which can be combined with any other embodiment described herein, the duplet of multipole plates in the first and/or the second multipole plate assembly may also be a triplet of multipole plates, including three single multipole plates. Further, the aperture assemblies may, according to different embodiments, be provided as a single plate, a plate duplet, a plate triplet or an assembly with an even higher number of plates.

A stack of a number of m plates allows adjusting for m conditions on the fundamental rays, provided that all potentials may be chosen individually. The basic three conditions of the fundamental rays, which guarantee that the corrector does not introduce a 3-fold astigmatism are as follows: firstly, the effective plane of the first multipole assembly is imaged as a 1:1 image into the effective plane of the second multipole assembly. According to some embodiments, the second multipole plate assembly may be identical to the first multipole plate assembly. Secondly, the γ-ray has a zero in both multipole plate assemblies and therefore maintains its rotational symmetry. Thirdly, the plane of an (astigmatic) intermediate image between the multipole plate assemblies is made a symmetry plane of the γ-ray between the multipole plate assemblies and of the whole arrangement which implies that the two multipole plate assemblies can be identical or at least mirror symmetric with respect to the middle plane. Thus the first order non rotationally symmetric effects of the multipoles cancel out. The remaining third order effect is used in order to influence the spherical aberration.

Figure 5A:
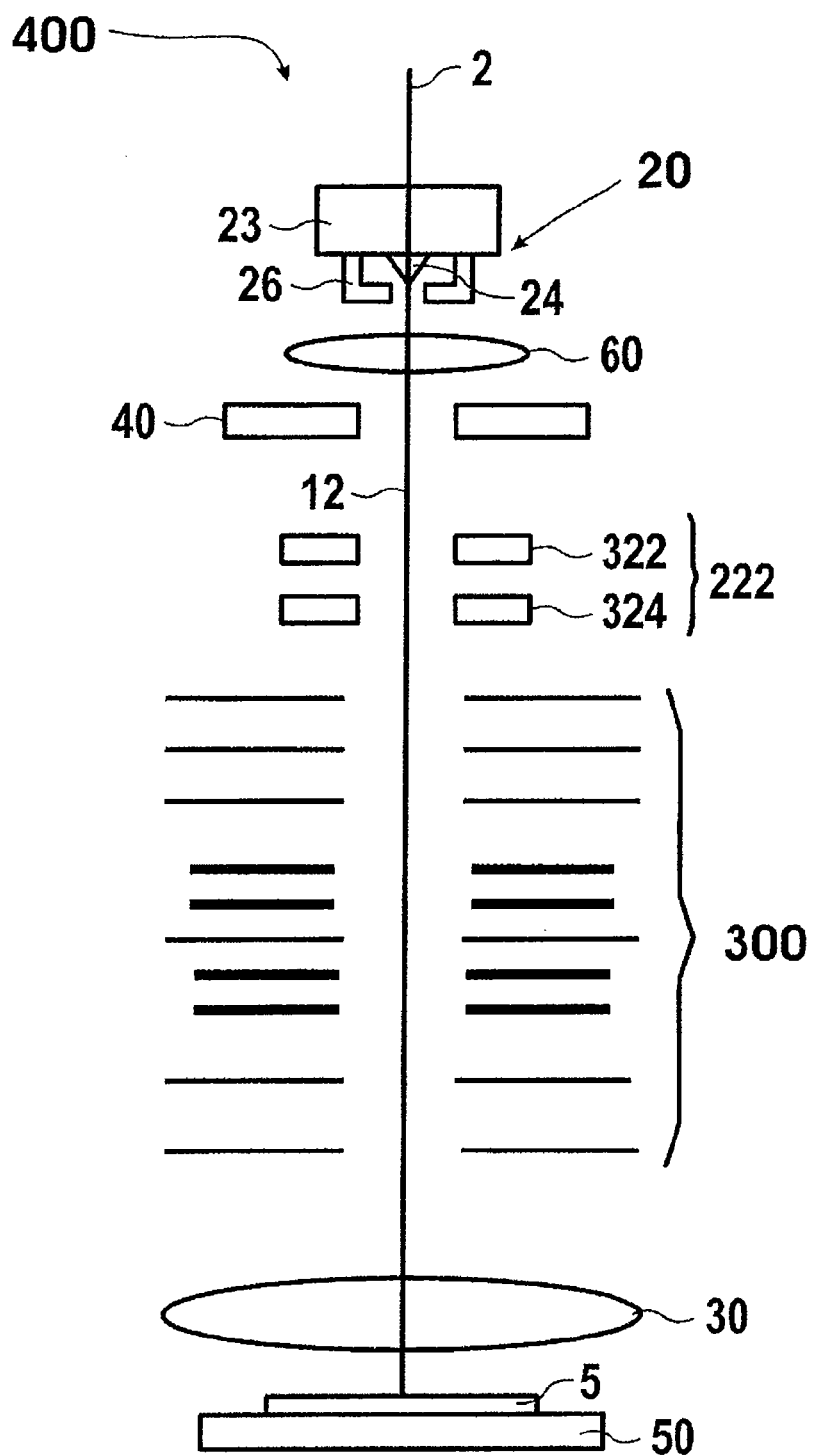
FIG. 5a shows a schematic view of a charged particle beam device according to embodiments described herein.

FIG. 5a shows a charged particle beam device 400 including a correction device according to embodiments described herein. The charged particle beam device includes an emitter gun 20 having an emitter tip 24, a base 23 and a suppressor 26. Further, the charged particle beam device 400 includes a condenser lens 60, an objective lens 30, an aperture 40 and a deflector assembly 222. The deflector assembly 222 may include two deflectors 322, 324. The charged particle beam proceeds along optical axis 2 to a specimen 5, which is located on a specimen stage 50.

Along the optical axis 2 of the charged particle beam device 400, a correction device 300 is arranged. The correction device 300 includes a stack of plates as described with respect to FIG. 4a. The single plates are electrically isolated from each other and can be controlled individually.

The different plates are arranged so that the γ-ray has a zero in the plane of each of the multipole assemblies. Therefore, the off-axial Gaussian ray experiences no deviation from the rotational symmetry. The course of the axial Gaussian ray between the multipole assemblies is dependent on the orientation of the half-plane in which the axial ray propagates.

Figure 5B:
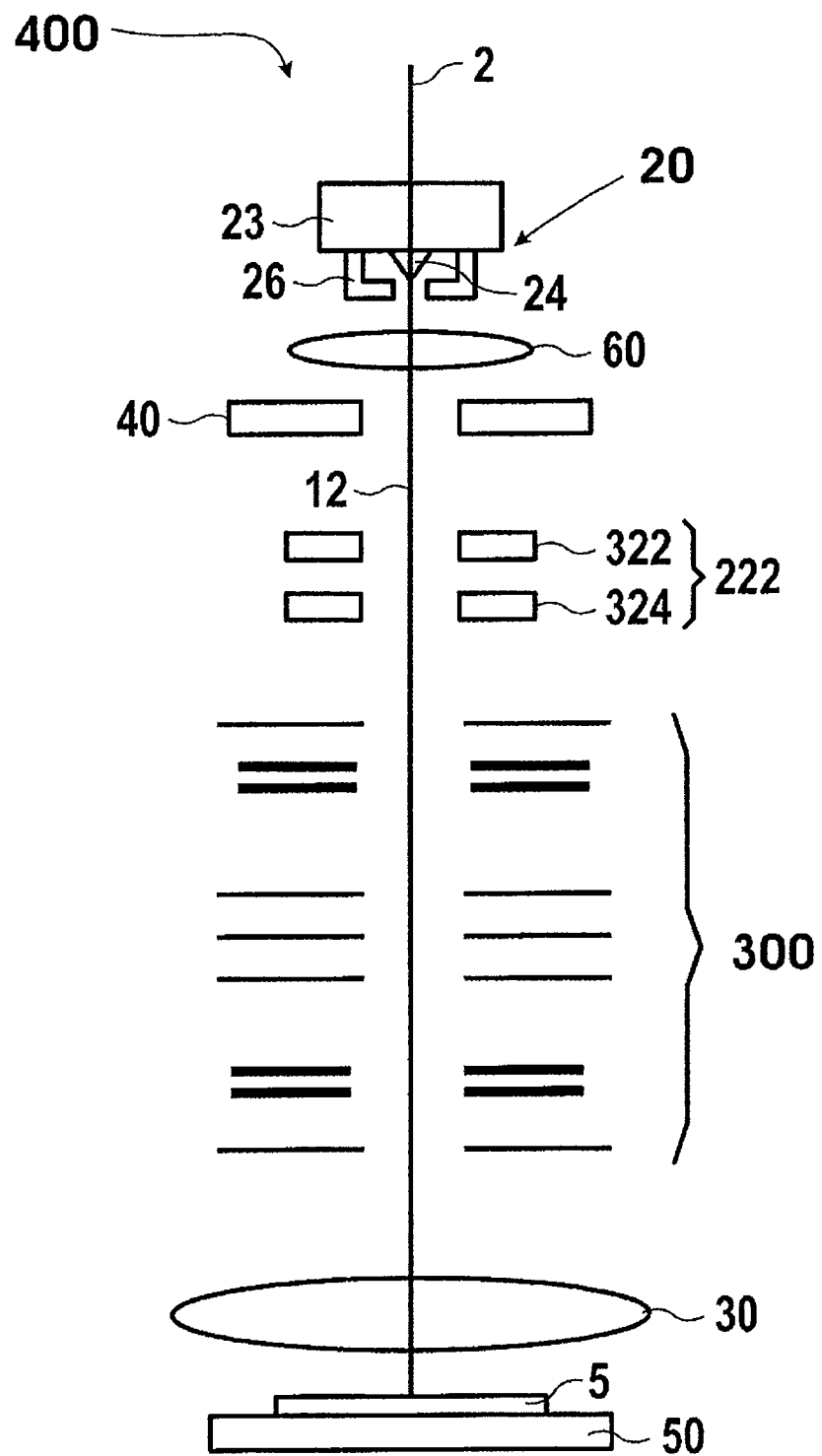
FIG. 5b shows a schematic view of another charged particle beam device according to embodiments described herein.

FIG. 5b shows a charged particle beam device according to some embodiments described herein. The correction device 300 refers to the correction device of FIG. 4b.

In an arrangement as exemplarily shown in FIG. 5b, high field strengths and potentials appear in the middle of the arrangement. The high field strengths and potentials can be avoided by using an arrangement as shown in FIG. 5a. In FIG. 5a, the potential in the area of the multipole plate assemblies is decreased. Thus, the strengths of the multipole fields are increased, thereby generating a negative spherical aberration, which is contrary to the spherical aberration of the lenses in the charged particle beam device. In both systems, the deviation from the rotational symmetry of the α-ray generated by the first multipole plate assembly (i.e. 3-fold astigmatism) is canceled out by the second multipole plate assembly.

By adjusting the potentials of the plates correctly, the above described 3-fold astigmatism can be reduced or corrected. The aberration can, for instance, be influenced by adjusting the potential of the second multipole plate assembly. Computer simulations show that its optimum value typically differs from the potential of the first multipole plate assembly by a few volts.

Unfortunately electrostatic arrangements introduce chromatic aberrations. According to a rule of thumb, the more often electrons are decelerated due to low potentials, with respect to the initial beam energy within an electrostatic arrangement, the stronger is the over all chromatic aberration introduced by the arrangement. Thus the corrector suffers from introducing a strong chromatic aberration. The problem may for instance be minimized by two strategies: 1) Use it together with a monochromator that reduces the energy spread in the beam.

2) Further increase the hexapole strength, for example by using hexapole plate triplets instead of hexapole duplets.

Figure 6:
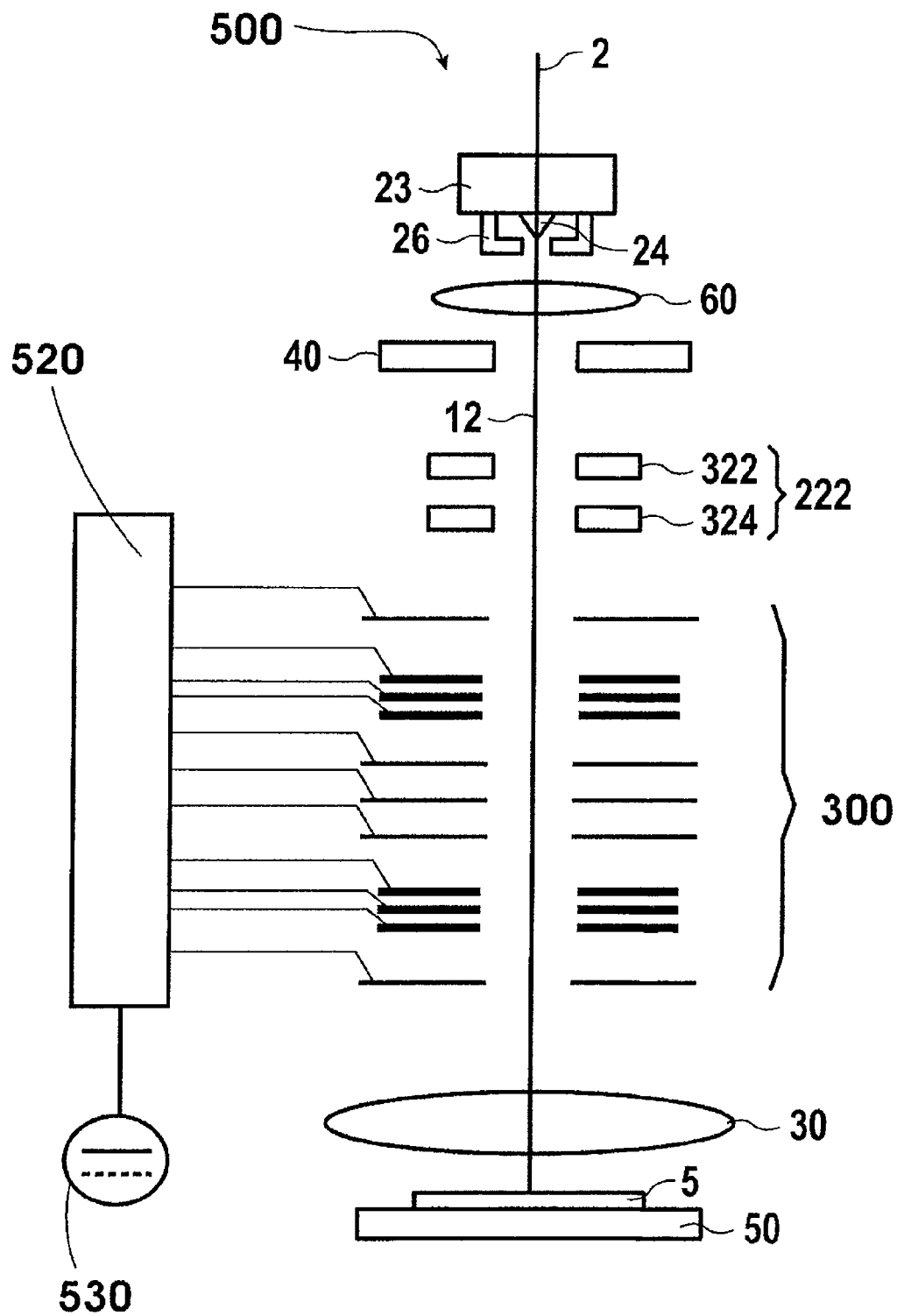
FIG. 6 shows a schematic view of a charged particle beam device with a controller according to embodiments described herein.

FIG. 6 shows an example of a charged particle beam device 500 according to embodiments described herein. The charged particle beam device 500 has a correction device similar to FIG. 4b. Instead of multipole plate duplets, multipole triplets are used in the multipole plate assemblies. In FIG. 6, a controller 520 can be seen, wherein each plate is controlled individually by the controller. The controller 520 can be connected to a power source 530. Each of the single plates is connected individually to the controller 520. Thus, the voltage, which is supplied to each plate, can be adjusted individually by the controller 520. Each plate in the aperture plate assemblies and in the multipole plate assemblies is therefore able to provide an adjustable potential in the respective plane.

Figure 7:
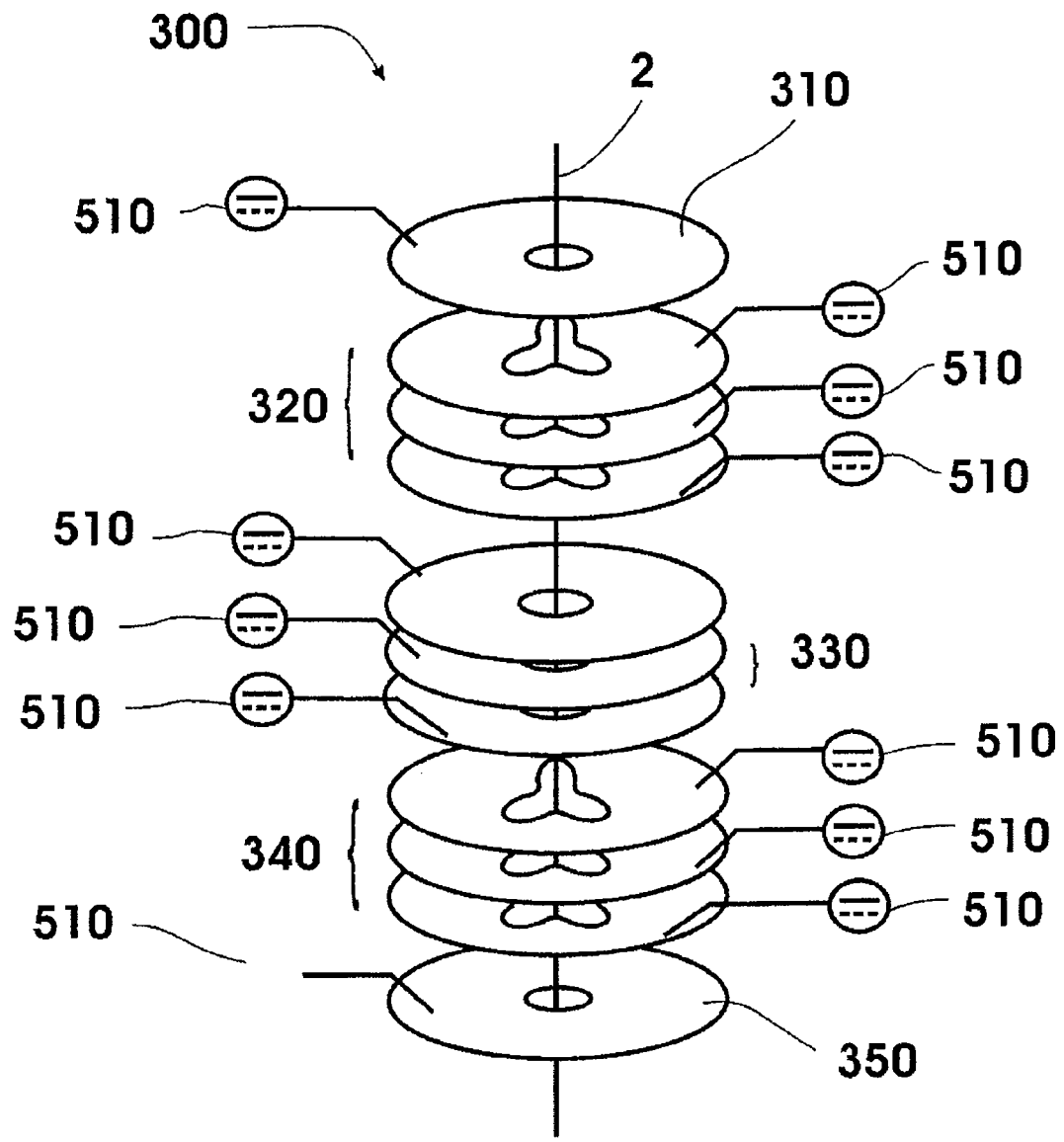
FIG. 7 shows a schematic, perspective view of the correcting device according to embodiments described herein.

FIG. 7 shows exemplarily a perspective, schematic view of the corrector 300 as shown in FIG. 6, wherein the multipoles are hexapoles. In this embodiment, each plate is connected to a power supply 510. The plurality of power supplies 510 is able, similar to the controller 520 of FIG. 6, to control the voltage supplied to the single plates of the stack of plates individually. The hexapole plates are exemplarily shown with a 3-fold symmetry shaped aperture, as can exemplarily be seen in FIG. 2b, but the apertures may also be shaped in any 3-fold symmetry shape.

According to some embodiments described herein, the potential of the multipole plates can be adjusted. The strength of the multipole effect is increased at constant field strength by decreasing the potentials of the multipole plates.

According to additional implementations, the corrector 300 shown for instance in FIG. 5a, can be used in a multi-beam-column device, wherein each column has a corrector device as shown in the figures described above. The optical axis 2 passes through the correction device in the shown manner.

A method of correcting an aberration in a charged particle beam device is provided. According to embodiments described herein, potentials are supplied to a stack of aperture and hexapole plates. The potentials are adjusted for each aperture and hexapole plate so that each plate is biased on one potential at a time.

According to further embodiments, a method of correcting the spherical aberration of a charged particle beam in a charged particle beam device is provided, wherein the charged particle beam device has an optical axis and a stack of plates, which includes a first and a second hexapole plate assembly. According to common devices correcting spherical aberrations, the column is adjusted such that the effective plane of the first hexapole plate assembly coincides with an image plane. Furthermore this image plane is imaged as a 1:1 image into the effective plane of the second hexapole plate assembly. An intermediate plane between the first and the second image plane makes a symmetry plane for the off-axial ray and a symmetry plane for the stack of plates.

According to some embodiments, the plates can be adjusted and controlled individually. The term "adjustment" refers to an adjustment in any manner, such as the adjustment of the location, or the adjustment of the applied potentials.

The term "off-axial ray" (γ-ray) and "axial ray" (α-ray) is to be understood with reference to FIG. 3. Thereby, the off-axial ray 311 is a ray, which has a zero, i.e. intersects the optical axis in the effective plane of the hexapole assemblies. Because a hexapole has vanishing field strength towards its center, the off-axial ray is not influenced by the hexapoles and thus keeps its rotational symmetry (with respect to the optical axis).

The term "axial ray" should be understood with respect to rays 312, 313 of FIG. 3. The rotational symmetry of these rays is disturbed by the first hexapole (assembly) of the corrector but is recovered by the second one, provided that the corrector is properly adjusted. Thus the path of an axial ray in the area in between the two Hexapoles changes with its azimuth position.

Figure 8:
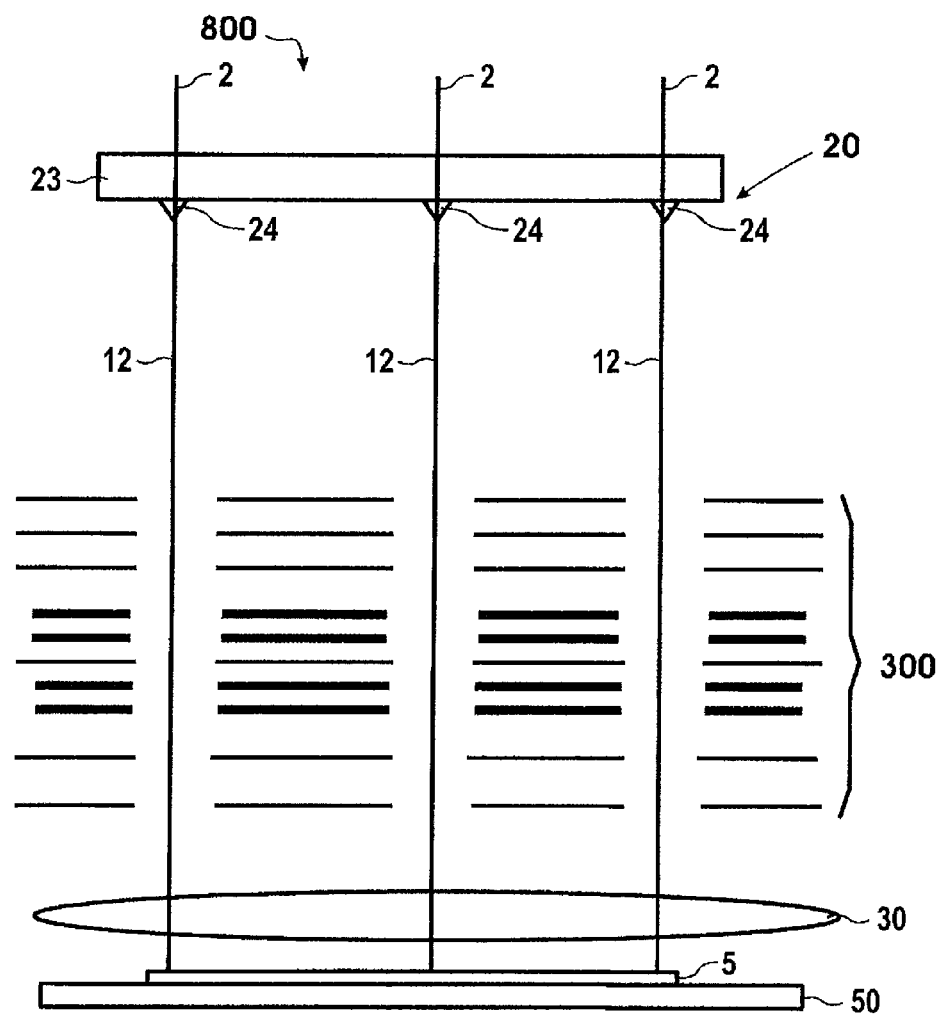
FIG. 8 shows a schematic view of an array of charged particle beam devices according to embodiments described herein.

FIG. 8 shows a multi-beam device 800 including a correction device according to embodiments described herein. The charged particle beam device includes a plurality of emitter guns 20 having an emitter tip 24, and a base 23. A plurality of charged particle beams proceeds along optical axes 2 to specimen 5, which is located on a specimen stage 50.

Along the optical axes 2 of the array correction device 800, a correction device 300 is arranged. The correction device 300 includes a stack of plates similar to that described with respect to FIG. 4a, further including several apertures in each plate through which the plurality of charged particle beams 12 can pass. Thus, according to yet further embodiments, which can be combined with any of the embodiments described herein, a correction device for correcting aberrations of a plurality of charged particle beams can be provided. Thereby, a correction device in the form of an array can be provided. In light of the simplified control of the correction devices according to embodiments described herein, and in light of the ability to be miniaturized, the plurality of beams can be corrected by a plurality of correction devices as described herein. Additionally or alternatively, as for example shown in FIG. 8, two or more openings can be provided in each of the plates of the stack of plates. Thereby, a plurality of beams can each pass through one of the aperture openings of an aperture plate.

In more detail, the stack of plates can include a first and a second multipole plate assembly, including each at least a multipole plate. The multipole plates in this embodiment show a plurality of n-fold symmetry aperture arrangements. Typically, for each charged particle beam, there is at least one aperture arrangement in a plate. The single plates are electrically isolated from each other and can be controlled individually.

According to one embodiment, a correction device for a charged particle beam device for correcting aberrations of a charged particle beam is provided. The correction device includes a stack of plates arranged along an optical axis of the charged particle beam device. Typically, the stack of plates includes at least a first and a second multipole plate assembly, wherein the first and the second multipole plate assembly each comprises at least a first multipole plate with an n-fold symmetry aperture arrangement, wherein the number of poles of the multipole of the multipole plate is 2n and the multipole plates are adapted to be biased to one potential respectively.

According to a further embodiment, a correction device is provided, as described above, wherein the stack of plates may include in order a first aperture plate assembly having at least one first aperture plate; the first multipole plate assembly; a second aperture plate assembly having at least one second aperture plate; the second multipole plate assembly; and a third aperture plate assembly having at least one third aperture plate.

According to embodiments, which can be combined with other embodiments described herein, the multipole may be a hexapole and the n-fold symmetry can be a 3-fold symmetry.

Typically, the first and/or the second hexapole plate assembly can be a duplet of a hexapole plates. According to other embodiments, the first and/or the second hexapole plate assembly may be a triplet of hexapole plates.

According to some embodiments described herein, a plane between the first and the second multipole plate assembly may define a symmetry plane of the correction device along the beam path of the charged particle beam device.

According to some embodiments, which can be combined with other embodiments described herein, the plane of the second multipole plate assembly may be reproduced as a 1:1 replica of the plane of the first multipole plate assembly.

Typically, every single plate of the stack of plates may be electrically isolated from the others. According to some embodiments, which can be combined with other embodiments described herein, the first hexapole plate assembly and the second hexapole plate assembly may be identical.

Typically, every plate of the stack of plates may be individually controlled.

According to some embodiments, which can be combined with other embodiments described herein, the plates of the stack of plates may be arranged at a defined distance from one another.

Typically, the n-fold symmetry aperture arrangement of the multipole plate may be an aperture with the shape of an equilateral triangle. According to further embodiments, the outer shape of the plates may be circular.

According to embodiments, which can be combined with other embodiments described herein, the longitudinal size of the correction device is between 0.01 m and 0.05 m.

According to further embodiments, a charged particle beam device is provided. The charged particle beam device includes a correction device for correcting aberrations of a charged particle beam. The correction device includes a stack of plates arranged along an optical axis of the charged particle beam device. Typically, the stack of plates includes at least a first and a second multipole plate assembly, wherein the first and the second multipole plate assembly each include at least a first multipole plate with an n-fold symmetry aperture arrangement, wherein the number of poles of the multipole of the multipole plate is 2n and the multipole plates are adapted to be biased to one potential respectively.

According to some embodiments, which can be combined with embodiments of the above described charged particle beam device, the charged particle beam device may include a multi-column arrangement, each having a correction device as described herein.

Typically, the correction device of the charged particle beam device is an array correction device, wherein the at least one multipole plate of the first and the second multipole plate assembly may include two or more n-fold symmetry aperture arrangements.

According to some embodiments, which can be combined with other embodiments described herein, the charged particle beam device may include a controller to control the single plates of the stack of plates individually.

According to further embodiments, a method of correcting an aberration of a charged particle beam in a charged particle beam device having an optical axis and stack of plates, with an electrostatic multipole corrector is provided. The method includes providing at least a first and a second multipole plate assembly including each at least one multipole plate arranged along the optical axis and thereby, forming the stack of plates; generating a multipole by the multipole plate of the first multipole plate assembly and generating a multipole by the multipole plate of the second multipole plate assembly, wherein the multipoles are generated by biasing the multipole plates to a single potential respectively.

According to some embodiments, which can be combined with other embodiments described herein, the first multipole plate assembly may define a first image plane and a second image plane. Typically, the method further includes imaging the first image plane as a 1:1 image in the second image plane; guiding an off-axial beam of the charged particle beam such that the off-axial beam subtends the optical axis in the first and the second image plane; and guiding the off-axial beam such that an intermediate plane between the first and the second plane is a symmetry plane for the off-axial beam between the first image plane and the second plane and is a symmetry plane for the stack of plates.

According to some embodiments, which can be combined with other embodiments described herein, the potentials of the first and the second hexapole plate assembly may differ.

Typically, the distance between the first and the second hexapole plate assembly is arranged to be 0.01 m.

According to some embodiments, the aberration is a spherical aberration.

Typically, the difference of the potentials of the first and the second hexapole plate assembly is adjusted to be about 1 to 3 V.

According to some embodiments, which can be combined with other embodiments described herein, the stack of plates may include aperture plates.

While the foregoing is directed to embodiments of the invention, other and further embodiments of the invention may be devised without departing from the basic scope thereof. The scope thereof is determined by the claims that follow.

The invention claimed is:

1. A correction device for a charged particle beam device for correcting aberrations of a charged particle beam, the correction device comprising:
   a stack of plates arranged along an optical axis of the charged particle beam device, the stack of plates comprising:
   at least a first and a second multipole plate assembly, wherein the first and the second multipole plate assembly each comprises at least a first multipole plate with a 3-fold symmetry aperture arrangement wherein the multipole of the multipole plate is a hexapole, and the multipole plates are adapted to be biased to one potential respectively.

2. The correction device according to claim 1, wherein the stack of plates comprises, in order:
   a first aperture plate assembly having at least one first aperture plate;
   the first multipole plate assembly;
   a second aperture plate assembly having at least one second aperture plate;
   the second multipole plate assembly; and
   a third aperture plate assembly having at least one third aperture plate.

3. The correction device according to claim 1, wherein at least one of the group consisting of the first and the second multipole plate assembly is a duplet of multipole plates.

4. The correction device according to claim 1, wherein at least one of the group consisting of the first and the second multipole plate assembly is a triplet of multipole plates.

5. The correction device according to claim 1, wherein a plane between the first and the second multipole plate assembly defines a symmetry plane of the correction device along the beam path of the charged particle beam device.

6. The correction device according to claim 1, wherein each of the first multipole plate assembly and the second multipole plate assembly provides an effective plane, and wherein the effective plane of the first multipole plate assembly is imaged as a 1:1 image into the effective plane of the second multipole plate assembly.

7. The correction device according to claim 1, wherein every single plate of the stack of plates is electrically isolated from the others.

8. The correction device according to claim 1, wherein the first multipole plate assembly and the second multipole plate assembly are identical.

9. The correction device according to claim 1, wherein every plate of the stack of plates can be individually controlled.

10. The correction device according to claim 1, wherein the plates of the stack of plates are arranged at a defined distance from one another.

11. The correction device according to claim 1, wherein the 3-fold symmetry aperture arrangement of the multipole plate is an aperture with the shape of an equilateral triangle.

12. The correction device according to claim 1, wherein the outer shape of the plates is circular.

13. The correction device according to claim 1, wherein the longitudinal size of the correction device is between 0.01 m and 0.05 m.

14. A charged particle beam device comprising a correction device for correcting aberrations of a charged particle beam, the correction device comprising:
   a stack of plates arranged along an optical axis of the charged particle beam device, the stack of plates comprising:
   at least a first and a second multipole plate assembly, wherein the first and the second multipole plate assembly each comprises at least a first multipole plate with a 3-fold symmetry aperture arrangement wherein the multipole plate is a hexapole, and the multipole plates are adapted to be biased to one potential respectively.

15. The charged particle beam device according to claim 14, wherein the charged particle beam device comprises a multi-column arrangement, each having a correction device according to claim 14.

16. The charged particle beam device according to claim 14, wherein the correction device is an array correction device, and wherein the at least one multipole plate of the first and the second multipole plate assembly comprises two or more n-fold symmetry aperture arrangements.

17. The charged particle beam device according to claim 14, further comprising a controller to control the single plates of the stack of plates individually.

18. A method of correcting an aberration of a charged particle beam in a charged particle beam device having an optical axis and a stack of plates, with an electrostatic multipole corrector, comprising:
   providing at least a first and a second multipole plate assembly each comprising at least one multipole plate arranged along the optical axis and thereby, forming the stack of plates, wherein the multipole plates comprise a 3-fold symmetry aperture arrangement;
   generating a hexapole by the multipole plate of the first multipole plate assembly and generating a hexapole by the multipole plate of the second multipole plate assembly, wherein the multipoles are generated by biasing the multipole plates to a single potential respectively.

19. The method according to claim 18, wherein the first multipole plate assembly and the second multipole plate assembly each define an effective plane coinciding with a respective first image plane of the first multipole assembly and a second image plane of the second multipole assembly, the method further comprising:
   imaging the effective plane of the first multipole assembly as a 1:1 image into the effective plane of the second multipole plate assembly;
   guiding an off-axial beam of the charged particle beam such that the off-axial beam subtends the optical axis in the first and the second image plane; and
   guiding the off-axial beam such that an intermediate plane between the first and the second plane is a symmetry plane for the off-axial beam between the first image plane and the second plane and is a symmetry plane for the stack of plates.

20. The method according to claim 18, wherein the first and the second multipole plate assemblies are provided at different potentials.

21. The method according to claim to 18, wherein the distance between the first and the second multipole plate assembly is arranged to be 0.01 m.

22. The method according to claim 18, wherein the aberration is a spherical aberration.

23. The method according to claim 18, wherein the difference of potentials of the first and the second multipole plate assembly is adjusted to be about 1 to 3 V.

24. The method according to claim 18, wherein the stack of plates comprises aperture plates.

\* \* \* \* \*